United States Patent
Jin

Patent Number: 5,978,503
Date of Patent: Nov. 2, 1999

[54] METHOD FOR RECOGNIZING CORNERS OF AN ANGULAR COMPONENT

[75] Inventor: Sang-Hun Jin, Taegu, Rep. of Korea

[73] Assignee: Daewoo Electronics Co., Ltd., Seoul, Rep. of Korea

[21] Appl. No.: 08/865,842

[22] Filed: May 30, 1997

[30] Foreign Application Priority Data

May 30, 1996 [KR] Rep. of Korea ...................... 96-18841
May 30, 1996 [KR] Rep. of Korea ...................... 96-18842
May 30, 1997 [KR] Rep. of Korea ...................... 96-18843

[51] Int. Cl.$^6$ ................................................... G06K 9/00
[52] U.S. Cl. ............................................................ 382/147
[58] Field of Search ...................... 382/147, 151, 382/241, 197, 242; 348/126, 94, 95; 356/376; 364/700

[56] References Cited

U.S. PATENT DOCUMENTS 3,576,980   5/1971   Doyle ....................................... 364/700
5,668,894   9/1997   Hamano et al. ......................... 382/242

FOREIGN PATENT DOCUMENTS 1 234 507   6/1971   United Kingdom .

Primary Examiner—Joseph Mancuso
Assistant Examiner—Vikkram Bali
Attorney, Agent, or Firm—Pillsbury Madison & Sutro LLP

[57] ABSTRACT

In a method for recognizing corners of an angular component, an image of a subject including the angular component is taken and outline pixels of the angular component are detected. Vector sums of first and second position vectors are calculated based on the outline pixels. A reference value having a predetermined magnitude is sampled from the vector sums. A threshold value for detecting corners of the angular component is calculated based on the reference value. The vector sums are sequentially compared with the threshold value in order to judge whether or not the corners thereof are detected according to the comparison result. It will be decided whether an operation of recognizing the corners thereof has succeeded through detecting corners of the angular component. The corners of angular component can be recognized at a high speed through the exact performance of the recognition processes, thereby mounting the components to an accurate position of the printed circuit board.

8 Claims, 7 Drawing Sheets

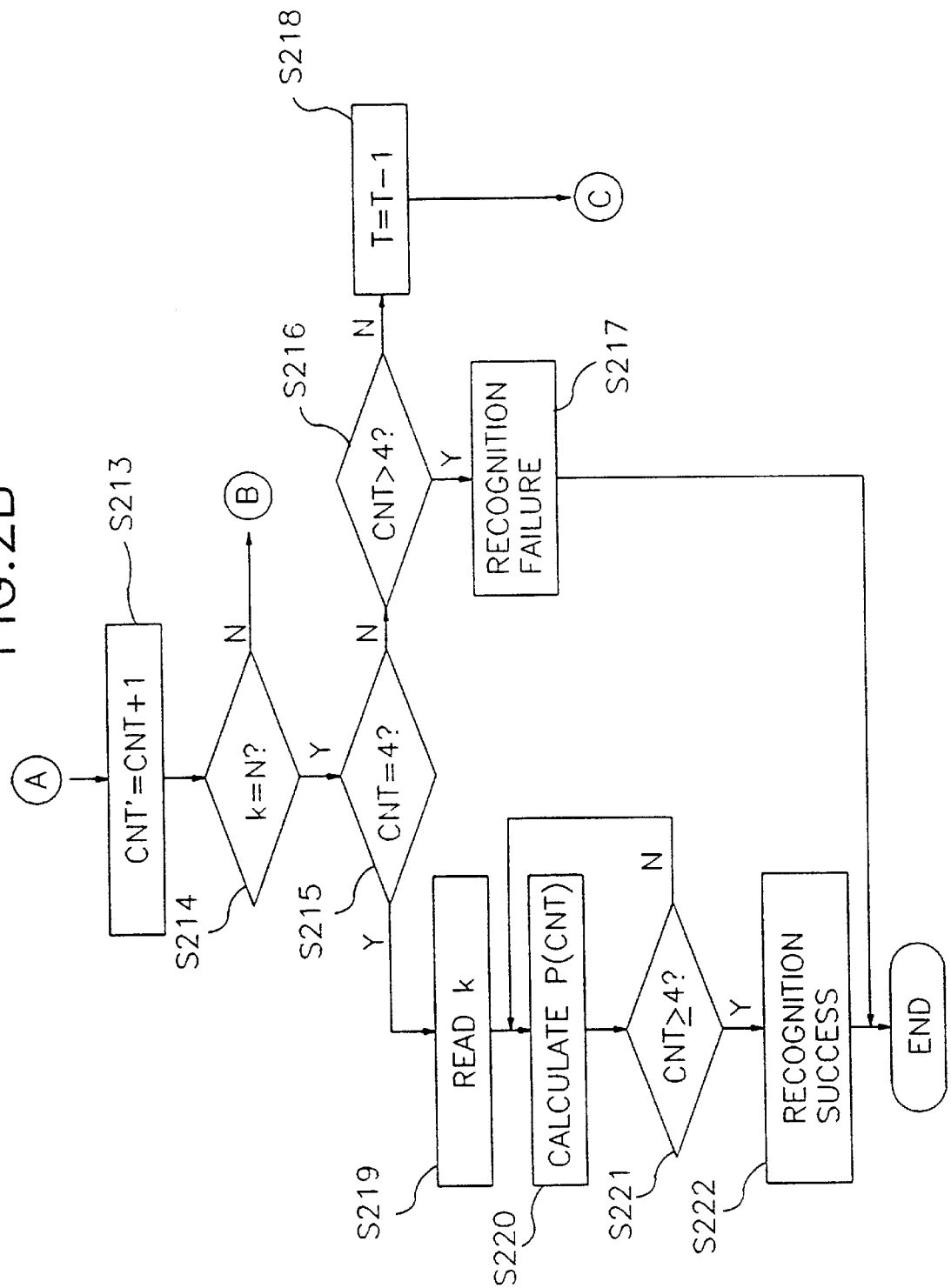

METHOD FOR RECOGNIZING CORNERS OF AN ANGULAR COMPONENT

BACKGROUND OF THE INVENTION

1. Field of the Invention

The present invention relates to a chip mounter, and more particularly to a method for recognizing corners of an angular component such as a square component in the chip mounter to be mounted on the printed circuit board (PCB).

2. Prior Art

In general, PCBs are boards on which several electronic components are integrated. The dense wiring of the electronic components on the PCBs can be accomplished through a printing method. Recently, single pattern PCBs are being miniaturized with high density double faces or multiple layers so that the single patten PCBs can be manufactured in large quantities at one time. Moreover, an industrial robot equipped with an apparatus which can perform a sight function that is highly adaptable and efficient has been proposed.

A chip mounter includes an image recognition device constituted by a cognitive camera, an image signal processor, and a microprocessor. The chip mounter recognizes a posting of chip components which adhere to a nozzle and controls corners and an angle of the chip components at the next station according to the recognition result. In order to exactly recognize and correct the location and the angle of the square component 104 which adhere to the nozzle, the chip mounter controls the image recognition device to take a picture with respect to an image of the square component 104. The chip mounter judges a posting of chip components through the image thereof and corrects the chip component to an accurate posture by using the judged posting thereof. Accordingly, an operation for recognizing the posting of the chip components which are adherent to the nozzle should be performed. A performance of the chip mounter is influenced by how precisely and quickly the recognition process is performed. If the recognition operation is carried out in an abnormal state, the chip mounter cannot mount the chip components at the corresponding position by component data which are stored therein, resulting in a deterioration of the quality of the produced goods.

U.S. Pat. No. 4,674,869 issued to Timothy R. Pryor et al. discloses a method and apparatus for electro-optically determining dimension, location, and altitude of objects. A first embodiment of the method and apparatus describes optical triangulation based coordinate measurement of complex surfaces, such as gear teeth and turbine blades. Another embodiment provides highly useful sensors for robot guidance and related purposes. However, the patent of Timothy R. Pryor et al. does not disclose a method for recognizing corners of a square component.

SUMMARY OF THE INVENTION

Accordingly, it is a first object of the present invention, which has been devised in the light of the above-described problems, to provide a method capable of recognizing corners of an angular component in a chip mounter by using a vector sum.

It is a second object of the present invention to provide a method capable of recognizing corners of an angular component in a chip mounter by using a vector difference.

It is a third object of the present invention to provide a method capable of recognizing corners of an angular component in a chip mounter by using an inner vector product.

To achieve the objects of the present invention, the present invention provides a method for recognizing corners of an angular component in a chip mounter. The method comprises the steps of storing a total number of a desired angular component; detecting outline pixels of the angular component by taking an image with respect to a subject including the angular component; calculating calculation values of first and second position vectors based on the outline pixels, wherein the first and second position vectors are between a reference outline pixel and a first outline pixel and between the reference outline pixel and a second outline pixel, respectively, and the first and second outline pixels are apart from the reference outline pixel by a predetermined number of pixels; sampling a reference value having a predetermined magnitude from the calculation values; calculating a threshold value for detecting corners of the angular component based on the reference value; sequentially comparing the calculating values with the threshold value and judging whether the corners of the angular component are detected according to the comparison result; and comparing all corners of the angular component with the stored total number of the desired angular component and deciding whether an operation of recognizing the corners has succeeded according to the comparison result.

Preferably, a magnitude of the calculating values varies according to the predetermined number of pixels, and an outline shape and a location of the angular component. More preferably, the calculating values includes sums, differences, and inner products of the first and second position vectors. Moreover, the angular component includes a triangular component and a square component.

BRIEF DESCRIPTION OF THE DRAWINGS

The above objects and other advantages of the present invention will become more apparent by describing in detail preferred embodiments thereof with reference to the attached drawings in which:

FIGS. 2A and 2B are flow charts for illustrating the method for recognizing corners of an angular component by using a vector sum according to a first embodiment of the present invention;

DETAILED DESCRIPTION OF THE PREFERRED EMBODIMENTS

Hereinafter, the present invention will be described in detail with reference to the accompanying drawings.

Figure 1:
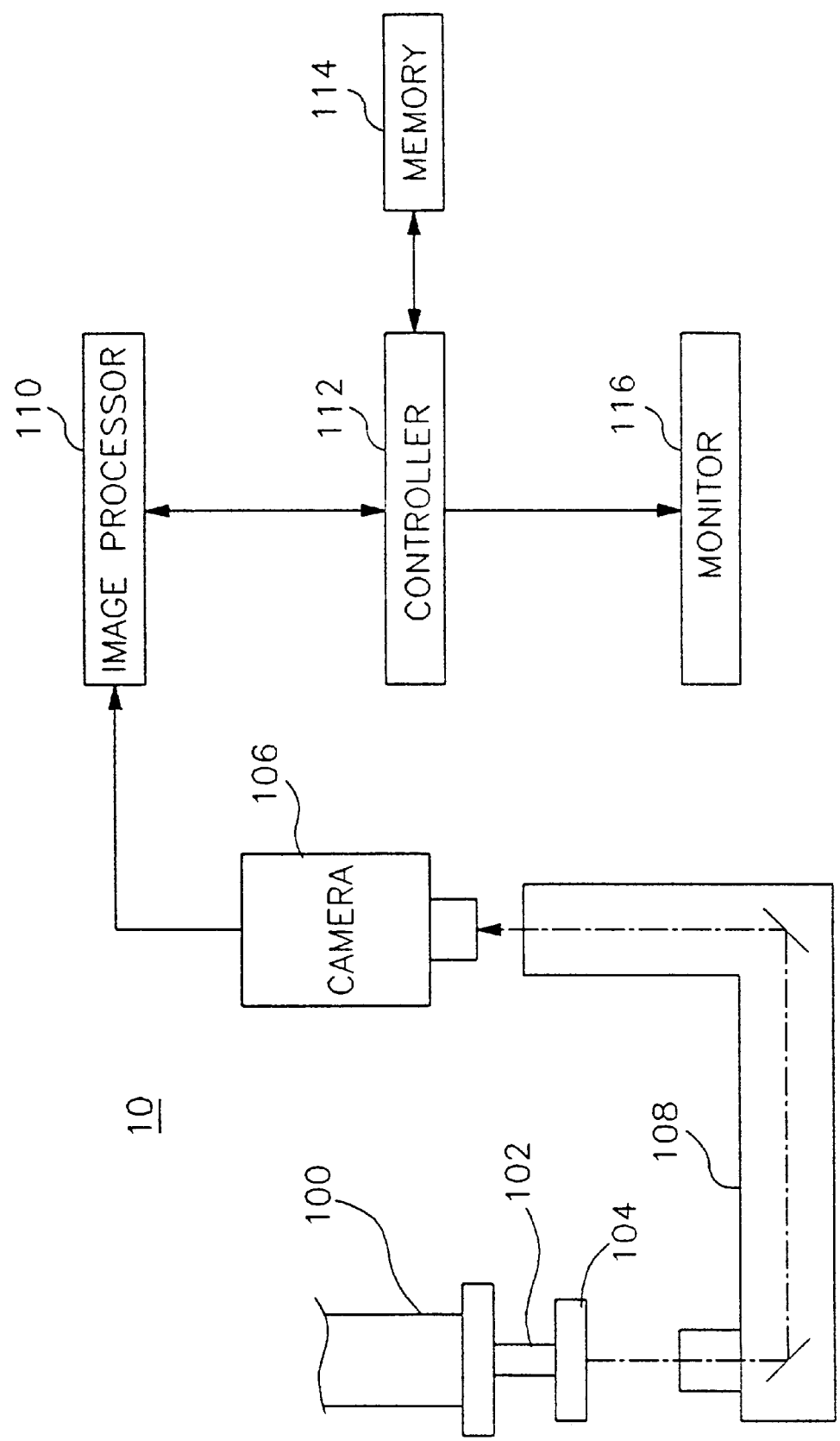
FIG. 1 is a block diagram of an image processor of a chip mounter system which can be used in order to perform the method for recognizing corners of an angular component in a chip mounter according to the present invention.

FIG. 1 shows a configuration of an image processor 10 of a chip mounter which can be used in order to perform the method for recognizing corners of an angular component in the chip mounter according to the present invention. Twelve or eighteen mount heads 100 are mounted to a turntable (not shown). A nozzle 102 is mounted to the mount heads 100. A chip component 104 adheres to the nozzle 102 through a vacuum. The chip component 104 includes an angular component 104 such as a triangle and a square component. A camera 106 takes a picture with respect to an image of the angular component 104 through a reflecting box 108 and transmits the image of the chip component 104 to an image processor 110. The image processor 110 processes the image of the chip component 104 from the camera 106 and provides the image data corresponding to the image of the angular component 104 to a controller 112. The controller 112 detects an information string of an outline pixel from the image data of the angular component 104. The controller 112 reads out a program and data for recognizing corners of an angular component 104 which are stored in a memory 114 based on the information string of outline pixels, to thereby recognize the location and distortion angle of the chip component 104 based on the program and data, and controls a monitor 116 to display the recognized result.

EMBODIMENT 1

A description of a principle of the method for recognizing corners of an angular component in a chip mounter by using a vector sum in accordance with the first embodiment of the present invention is as follows. It is assumed that an optional pixel coordinate selected from an information string of the outline pixels which is detected by the controller 112 of the image processor 10 of a chip mounter system is $Bi(x(i), y(i))$. A first outline pixel $Bi+m(x(i+m), y(i+m))$ and a second outline pixel $Bi-m(x(i-m), y(i-m))$ are located back and forth apart from the optional pixel $Bi(x(i), y(i))$ by a predetermined pixel number m in searched outline information, respectively. Also an A is a first position vector between the optional pixel $Bi(x(i), y(i))$ and the first outline pixel $Bi+m(x(i+m), y(i+m))$, a B is a second position vector between the optional pixel $Bi(x(i), y(i))$ and the second outline pixel $Bi-m(x(i-m), y(i-m))$, and a $Vsum(i)$ is the sum of the first position vector A and the second position vector B. The vector sum $Vsum(i)$ is a function which is subordinate to the predetermined pixel number m and an outline shape.

When the predetermined pixel number m is constant, the vector sum $Vsum(i)$ is a function which depends on the outline shape. In particular, in an angular chip component a predetermined pixel number m which is constant, when the outline is a straight line thereof, the vector sum $Vsum(i)$ has the smallest size. But when the optional pixel $Bi(x(i), y(i))$ is located at the corner thereof, the vector sum $Vsum(i)$ has the largest size.

Since a vector sum $Vsum(k)$ has local maximums with respect to 4 corners of the angular chip component 104, first of all a maximum value Vmax of the vector sum $Vsum(k)$ is calculated by means of an equation (1) which will be described later.

$$Vmax=V(maxi)=max(Vsum(k), k=1,2,\ldots,N-1,N) \quad (1)$$

The vector sum $Vsum(k)$ is divided into M stages or groups, for example 10 stages, based on the Vmax. The corners of the angular component 104 are searched from the highest stage to the lowest stage. The maximum values of the outline pixels which are equal to or greater than a predetermined value of each stage are set as a reference maximum value. The outline pixels which correspond to the reference maximum value are recognized as a corner coordinate $Pi(Xi,Yi)$. That is, the $Pi(Xi,Yi)$ is calculated by means of an expression (2), which will be described later.

$$Pi(Xi,Yi)=Bmaxi(X(maxi), Y(maxi)) \quad (2)$$

where the $Pi(Xi,Yi)$ indicates a coordinate of a corner of the angular component 104 if $Vsum(i)$ has a maximum value at an optional point Bi.

Since the angular component 104 may be distorted from 0° to 180°, we cannot know which points of the angular component 104 correspond to the $Pi(Xi,Yi)$, respectively. Accordingly, since the two corners which are adjacent to one another form two long sides, the corresponding location of each corner can be searched. The distortion angle of the angular component is calculated on the basis of an average value of the angle in which the two long sides form.

Figure 2A:
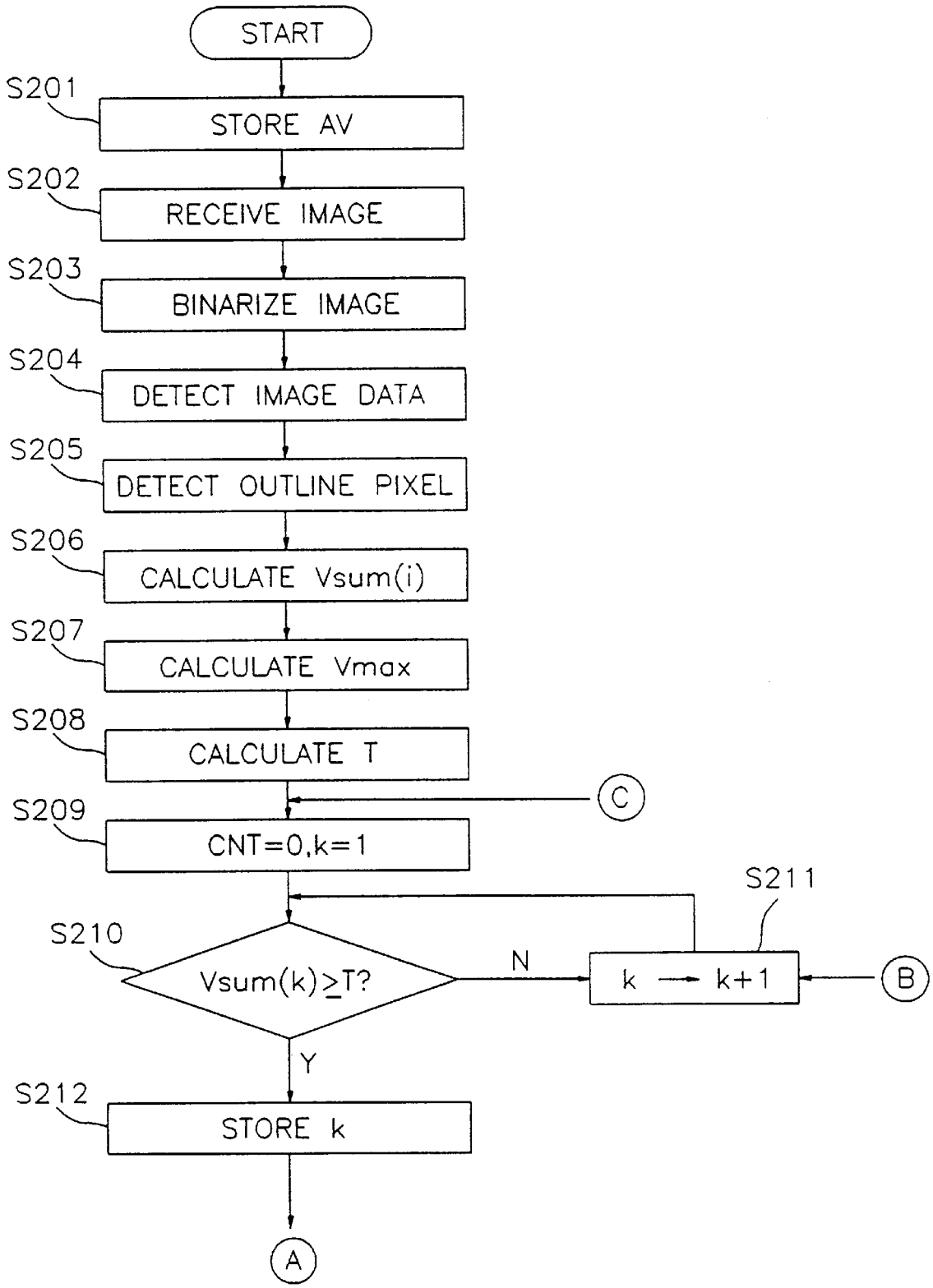

The operation of the method for recognizing corners of angular components in a chip mounter by using a vector difference according to the first embodiment of the present invention will hereinafter be described in detail with reference to FIGS. 1, 2A, and 2B. FIGS. 2A and 2B illustrate the method for recognizing corners of an angular component in a chip mounter by using a vector sum according to the first embodiment of the present invention. Before recognizing the location and the distortion angle of an angular component 104, the controller 112 controls the memory 114 to store an average value of a brightness in a predetermined pixel and a total number AV of corners of a desired angular component therein (step S201). For example, when a brightness of the candidate object is set at "1" and a brightness of the background of the candidate object is set at "0", the average value of a brightness may be determined as "½". Also, the total number AV of corners of a desired angular component is 3 when the angular component is a triangle component, and the total number AV is 4 when it is a square component.

Referring to FIG. 1, when the angular component 104 adhere to the nozzle 102 which is mounted to the mount heads 100 through a vacuum, the camera 106 takes a picture with respect to an image of the angular component 104 and transmits the image of the angular component 104 to the image processor section 110. The image processor 110 receives the image of a subject including the angular component 104 from the camera 106 and transmits the image of the subject to the controller 112 in step S202.

In step S203, the controller 112 binarizes the received image of the angular component 104 from the image processor 110. At this time, when the received image of the subject is greater than the average value AV ½ of a brightness which is stored in the memory 114, the received image of the subject is set at "1". On the contrary, when the received image of the subject is equal to or less than the average value AV of a brightness, the received image of the angular component 104 is set at "0".

In step S204, the image processor 110 detects image data of the angular component 104 from an upper left pixel to a lower right pixel of the subject and transmits the detected image data of the angular component 104 to the controller 112. In step S205, the controller 112 detects outline pixel data of the angular component 104 from the image data thereof detected by the image processor 110 by means of a well-known eight direction outline detection method. In step S206, the controller 112 calculates the vector sum $Vsum(i)$ of the first location vector A and the second location vector B based on the outline pixel data of the angular component 104.

In step S207, the controller 112 calculates a reference maximum value Vmax of the vector sum $Vsum(i)$ by means of the equation (1). In step S208, the controller 112 calculates a first threshold value T for detecting a corner of the angular component 104 by means of an equation (3) which will be described later.

$$T = Vmax*(M-CNT)/M, \ k=maxi \quad (3)$$

where the first threshold value T indicates a value which may be used in order to decide whether or not the outline pixel is the corner pixel. And when dividing between "0" and the maximum value Vmax into a predetermined interval, the M is the interval number, for example 10 stages including a first stage, a second stage, ..., a ninth stage, and a tenth stage. For instance, when dividing between "0" and the maximum value Vmax into 10 stages by the predetermined interval, the threshold value T indicates the value with respect to a tenth stage within 10% from the maximum value Vmax which is a value of a tenth stage. That is, the threshold value T is 9/10 of the reference maximum value Vmax. In step S209, the controller 112 starts a detection of a corner of the angular component 104 from a first outline pixel (k=1) and sets a corner count value CNT at "0" (CNT=0).

In step S210, the controller 112 judges whether or not an optional vector sum Vsum(k) is equal to or greater than the threshold value T. That is, the controller 112 sequentially judges whether or not a first vector sum Vsum(1), a second vector sum Vsum(2), ..., an N-1-th vector sum Vsum(N-1), an N-th vector sum Vsum(N) are equal to or greater than the threshold value T, respectively. When it is judged that the optional vector sum Vsum(k) is less than the threshold value T in step S210, the controller 112 adds "1" to the outline pixel number of the angular component 104 (step S211) and the routine returns to step S210 to thereby repeat the operation after step S210. On the contrary, when it is judged that the optional vector sum Vsum(k) is equal to or greater than the threshold value T in step S210, the controller 112 controls the memory 114 to store the outline pixel number "k" of the optional vector sum Vsum(k) therein (step S212). In step S213, the controller 112 adds "1" to a corner count value (CNT=CNT +1). In step S214, the controller 112 judges whether or not the outline pixel number "k" of the optional vector sum Vsum(k) is equal to the total number N of the outline pixels of the angular component 104. When it is judged that the outline pixel number "k" of the optional vector sum Vsum(k) is different from the total number N of the outline pixels in step S214, the routine returns to step S211 to thereby repeat the operation after step S211.

On the contrary, when it is judged that the outline pixel number "k" of the optional vector sum Vsum(k) is equal to the total number N of the outline pixels in step S214, the controller 112 judges whether or not a corner count value CNT in which is stored memory 114 is equal to a total number "4" of corners of the angular component 104 which is stored in the memory 114 in step S201(step S215). When it is judged that the corner count value CNT stored in memory 114 is different from the total number "4" of corners of the angular component 104 in step S215, the controller 112 judges whether or not the corner count value CNT is greater than "4" (step S216). When it is judged that the stored corner count value CNT is greater than "4" in step S216, the controller 112 controls the monitor 116 to display "RECOGNITION FAILURE" thereon (step S217) and a total operation finishes.

When it is judged that the stored corner count value CNT is greater than "4" in step S216, the controller 112 calculates a threshold value T with respect to a ninth stage by means of an equation (4) which will be described later (step S218).

$$T = T - Vmax/M, \ k=maxi \quad (4)$$

Then the routine returns to step S209 to thereby the operation after step S209.

On the other hand, when it is judged that the corner count value CNT stored in memory 114 is equal to the total number "4" of corners of the angular component 104 in step S215, the controller 112 reads out the outline pixel number "k" of the optional vector sum Vsum(k) which is stored in memory 114 in step S212 therefrom (step S219). The controller 112 calculates a coordinate of a corner of the angular component 104 corresponding to the outline pixel number "k" of the optional vector sum Vsum(k) in which Vsum(i) has a maximum value at an optional point Bi by means of an equation (5) which will be described later (step S220).

$$P(CNT) = Bmaxi(Xmaxi, Ymaxi) \quad (5)$$

In step S221, the controller 112 judges whether or not the stored corner count value CNT is equal to or greater than "4". When it is judged that the stored corner count value CNT is less than "4" in step S221, the routine returns to step S220 to thereby repeat the operation after step S220. That is, steps S220 and S221 repeat until the coordinates with respect to all 4 corners of the angular component 104 are searched. On the contrary, when it is judged that the stored corner count value CNT is equal to or greater than "4" in step S221, the controller 112 controls the monitor 116 to display "RECOGNITION SUCCESS" thereon (step S222) and the total operation finishes.

EMBODIMENT 2

A description of a principle of the method for recognizing corners of an angular component in a chip mounter by using a vector difference in accordance with the second embodiment of the present invention is as follows. It is assumed that an optional pixel coordinate selected from an information string of the outline pixels which is detected by the controller 112 of the image processor 10 of a chip mounter system is Bi(x(i), y(i)). A first outline pixel Bi+m(x(i+m), y(i+m)) and a second outline pixel Bi−m(x(i−m), y(i−m)) are located bach and forth apart from the optional pixel Bi(x(i), y(i)) by a predetermined pixel number m in searched outline information, respectively. Also an A is a first position vector between the optional pixel Bi(x(i), y(i)) and the first outline pixel Bi+m(x(i+m), y(i+m)), a B is a second position vector between the optional pixel Bi(x(i), y(i)) and the second outline pixel Bi−m(x(i−m), y(i−m)), and a Vdif(i) is the difference of the first position vector A and the second position vector B. The vector difference Vdif(i) is a function which is subordinate to the predetermined pixel number m and an outline shape.

When the predetermined pixel number m is constant, the vector difference Vdif(i) is a function which depends on the outline shape. In particular, in an angular chip component a predetermined pixel number m which is constant, when the outline is a straight line thereof, the vector difference Vdif(i) has the largest size. But when the optional pixel Bi(x(i), y(i)) is located at the corner thereof, the vector difference Vdif(i) has the smallest size.

Since a vector difference Vdif(k) has local maximums with respect to 4 corners of the angular component 104, first of all a minimum value Vdmin and a maximum value Vdmax of the vector difference Vdif(k) are calculated by means of an expression (6) which will be described later.

$$Vdmin = V(mini) = mini(Vdif(k), \ k=0, 1, \ldots, N-1) \quad (6)$$

$$Vdmax = V(maxi) = max(Vdif(k), \ k=0, 1, \ldots, N-1)$$

The vector difference Vdif(k) is divided into M stages, for example 10 stages, on the basis of the minimum value Vdmin. The corners of the angular component 104 are searched from the lowest stage to the highest stage. The minimum values of the outline pixels which are equal to or less than a predetermined value of each stage are set as a reference minimum value. The outline pixels which correspond to the reference minimum value are recognized as a corner Pi(Xi,Yi). That is, the Pi(Xi,Yi) is calculated by means of an expression (7) which will be described later.

$$Pi(Xi,Yi)=Bmini(X(mini), Y(mini)) \qquad (7)$$

where Pi(Xi,Yi) indicates a coordinate of a corner of the angular component 104 if Vdif(i) has a minimum value at an optional point Bi.

Since the angular component 104 may be distorted from 0° to 180°, we cannot know which points of the angular component 104 correspond to the corner Pi(Xi,Yi), respectively. Accordingly, since the two corners which are adjacent to one another form two long sides, the corresponding location of each corner can be searched. The distortion angle is calculated based on an average value of the angle in which the two long sides form.

Figure 3A:
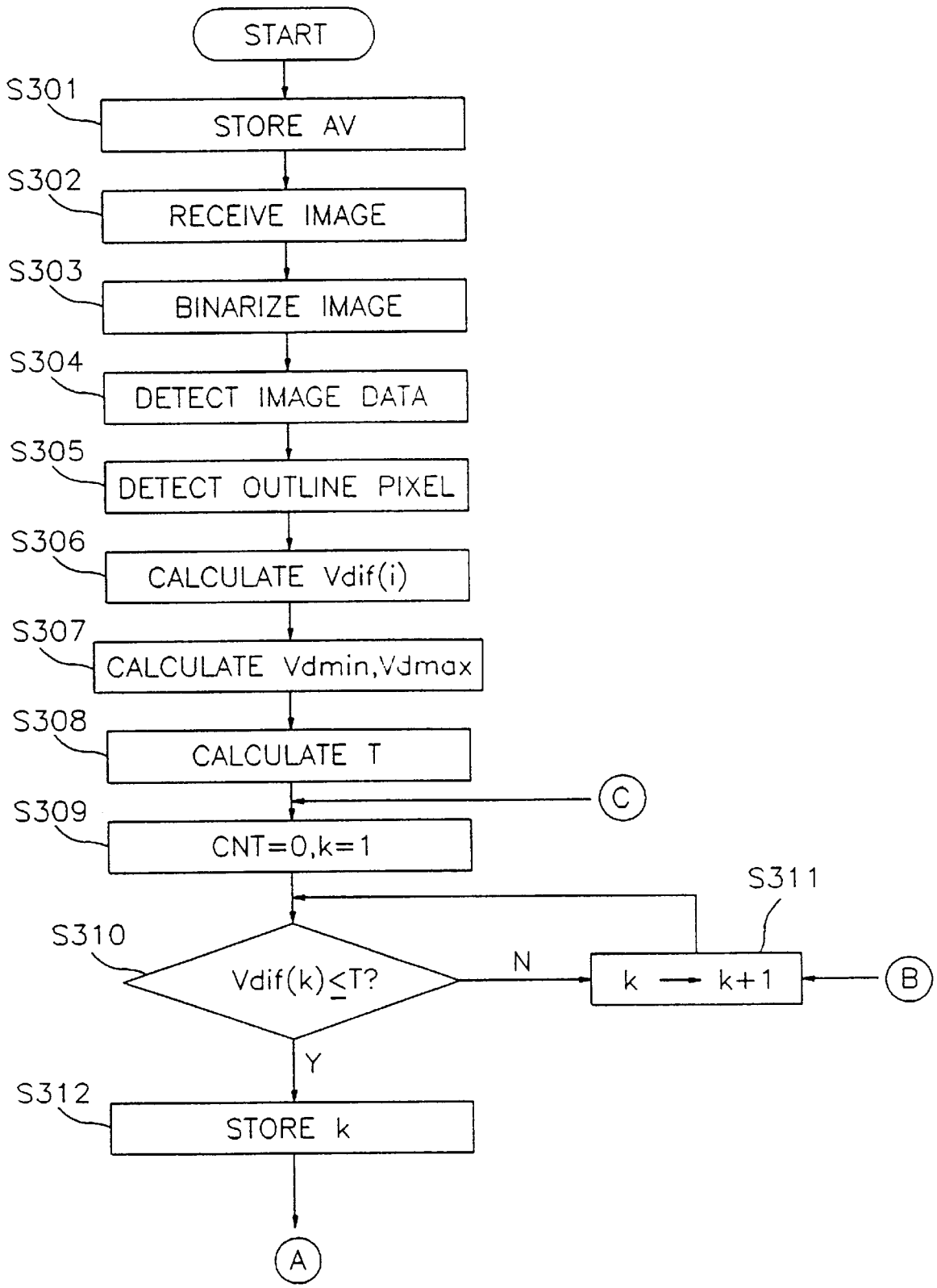
FIGS. 3A and 3B are flow charts for illustrating the method for recognizing corners of an angular component using a vector difference according to a second embodiment of the present invention.
Figure 3B:
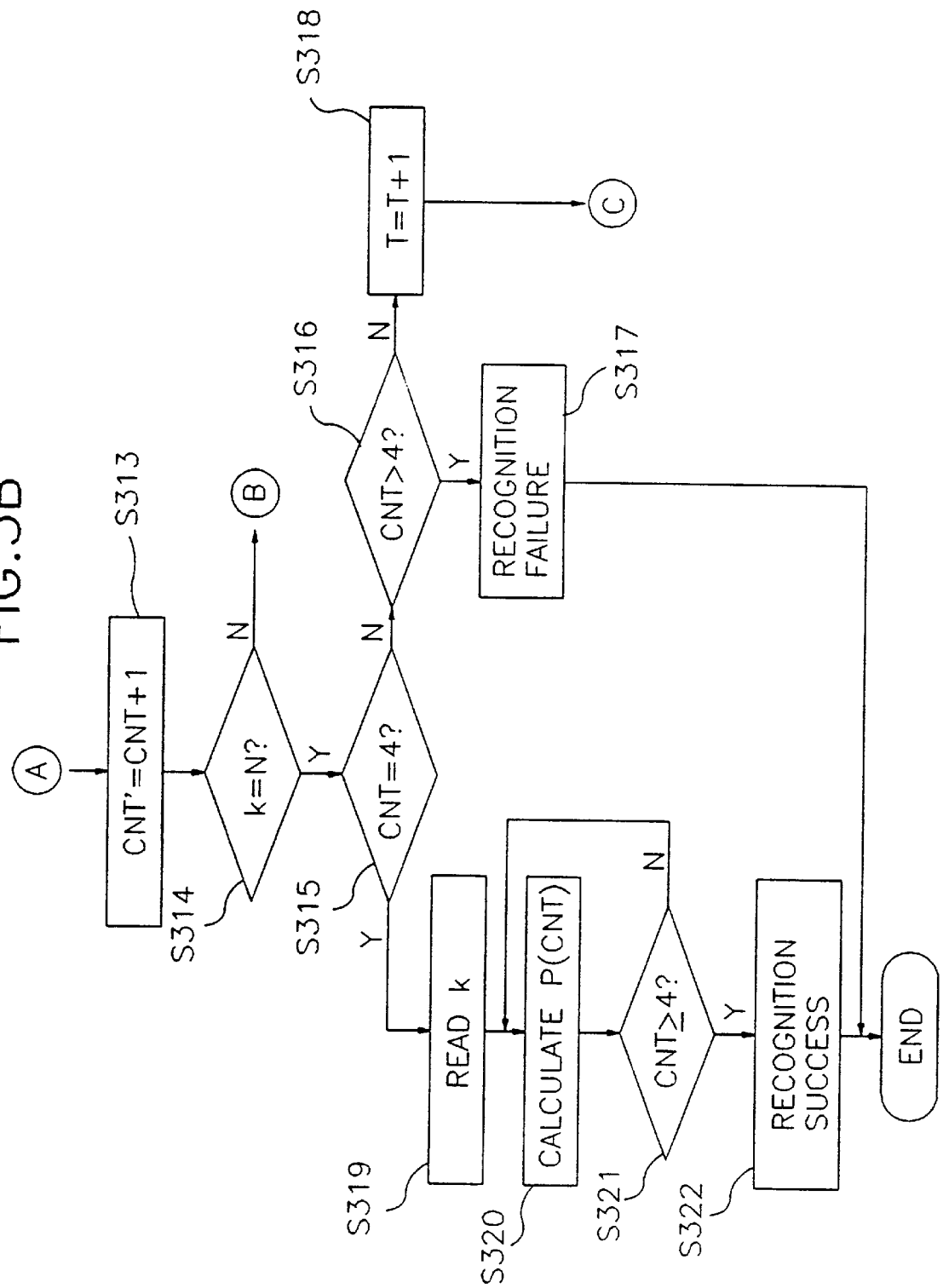

The operation of the method for recognizing corners of an angular component in a chip mounter by using a vector difference according to the second embodiment of the present invention will hereinafter be described in detail with reference to FIGS. 1, 3A, and 3B. FIGS. 3A and 3B illustrate the method for recognizing corners of an angular component in a chip mounter by using a vector difference according to the second embodiment of the present invention. Before recognizing the location and the distortion angle of angular components, the controller 112 controls the memory 114 to store an average value AV of a brightness in a predetermined pixel and a total number AV of corners of a desired angular component therein (step S301). For example, when a brightness of a brightness of the candidate object is set at "1" and a brightness of the background of the candidate object is set at "0", the average value of a brightness may be determined as "½". Also, the total number AV of corners of a desired angular component is 3 when the angular component is a triangle component, and the total number AV is 4 when it is a square component.

Referring to FIG. 1, when the angular component 104 adhere to the nozzle 102 which is mounted to the mount heads 100 through a vacuum, the camera 106 takes a picture with respect to an image of the chip component 104 and transmits the image of the angular component 104 to an image processor section 110. The image processor 110 receives the image of a subject including the angular component 104 from the camera 106 and transmits the image of the subject to the controller 112 in step S302. In step S303, the controller 112 binarizes the received image of the angular component 104 from the image processor 110. At this time, when the received image of the subject is greater than the average value AV of a brightness which is stored in the memory 114, the received image of the subject is set at "1". On the contrary, when the received image of the subject is equal to or less than the average value AV of a brightness, the received image of the angular component 104 is set at "0".

In step S304, the image processor 110 detects image data of the angular component 104 from an upper left pixel to a lower right pixel of the subject and transmits the detected image data of the angular component 104 to the controller 112. In step S305, the controller 112 detects outline pixel data of the angular component 104 from the image data thereof detected by the image processor 110 by means of a well-known eight direction outline detection method. In step S306, the controller 112 calculates the vector difference Vdif(i) of the first location vector A and the second location vector B based on the outline pixel data of the angular component 104.

In step S307, the controller 112 calculates a reference minimum value Vdmin and a maximum value Vdmax of the vector difference Vdif(k) by means of the equation (5). In step S308, the controller 112 calculates a threshold value T for detecting a corner of the angular component 104 by means of an equation (8) which will be described later.

$$T=Vdmin+(Vdmax-Vdmin)*CNT/M, k=mini \qquad (8)$$

where, the threshold value T indicates a value which may be used in order to decide whether or not the outline pixel is the corner pixel. And when dividing between the minimum value Vdmin and the maximum value Vdmax into a predetermined interval, the M is the interval number, for example 10 stages including a first stage, a second stage, . . . , a ninth stage, and a tenth stage. For instance, when dividing between the minimum value Vdmin and the maximum value Vdmax into 10 stages by the predetermined interval, the threshold value T indicates the value with respect to a first stage within 10% from the minimum value Vdmin which is a value of a first stage. That is the threshold value T is 1% of the reference minimum value Vdmin. In step S309, the controller 112 starts a detection of a corner of the angular component 104 from a first outline pixel (k=1) and sets a corner count value CNT at "0" (CNT=0).

In step S310, the controller 112 judges whether or not an optional vector difference Vdif(k) is equal to or less than the threshold value T. That is, the controller 112 sequentially judges whether or not a first vector difference Vdif(1), a second vector difference Vdif(2), . . . , an N-1-th vector difference Vdif(N-1), an N-th vector difference Vdif(N) are equal to or less than the threshold value T, respectively. When it is judged that the optional vector difference Vdif(k) is greater than the threshold value T in step S310, the controller 112 adds "1" to the outline pixel number of the angular component 104 (step S311) and the routine returns to step S310 to thereby repeat the operation after step S310.

On the contrary, when it is judged that the optional vector difference Vdif(k) is equal to or less than the threshold value T in step S310, the controller 112 controls the memory 114 to store the outline pixel number "k" of the optional vector difference Vdif(k) therein (step S312). In step S313, the controller 112 adds "1" to a corner count value (CNT=CNT+1). In step S314, the controller 112 judges whether or not the outline pixel number "k" of the optional vector difference Vdif(k) is equal to the total number N of the outline pixels of the angular component 104. When it is judged that the outline pixel number "k" of the optional vector difference Vdif(k) is different from the total number N of the outline pixels in step S314, the routine returns to step S311 to thereby repeat the operation after step S311.

On the contrary, when it is judged that the outline pixel number "k" of the optional vector difference Vdif(k) is equal to the total number N of the outline pixels in step S314, the controller 112 judges whether or not a corner count value CNT in which is stored memory 114 is equal to a total number "4" of corners of the angular component 104 which is stored in the memory 114 in step S301 (step S315). When it is judged that the corner count value CNT stored in memory 114 is different from the total number "4" of corners of the angular component 104 in step S315, the controller 112 judges whether or not the corner count value CNT is greater than "4" (step S316). When it is judged that the stored corner count value CNT is greater than "4" in step S316, the controller 112 controls the monitor 116 to display "RECOGNITION FAILURE" thereon and a total operation finishes.

When it is judged that the stored corner count value CNT is greater than "4" in step S316, the controller 112 calculates a threshold value T with respect to a second stage by means of an equation (9) which will be described later (step S318).

$$T=T+(Vdmax-Vdmin)/M, \quad k=mini \qquad (9)$$

Then the routine returns to step S309 to thereby the operation after step S309.

On the other hand, when it is judged that the corner count value CNT stored in memory 114 is equal to the total number "4" of corners of the angular component 104 in step S315, the controller 112 reads out the outline pixel number "k" of the optional vector difference Vdif(k) which is stored in memory 114 in step S312 therefrom (step S319). The controller 112 calculates a coordinate of a corner of the angular component 104 corresponding to the outline pixel number "k" of the optional vector difference Vdif(k) in which Vdif(i) has a minimum value at an optional point Bi by means of an equation (10) which will be described later (step S320).

$$P(CNT)=Bmini(Xmini, Ymini) \qquad (10)$$

In step S321, the controller 112 judges whether or not the stored corner count value CNT is equal to or greater than "4". When it is judged that the stored corner count value CNT is less than "4" in step S321, the routine returns to step S320 to thereby repeat the operation after step S320. That is, steps S320 and S321 repeat until the coordinates with respect to all 4 corners of the angular component 104 are searched. On the contrary, when it is judged that the stored corner count value CNT is equal to or greater than "4" in step S321, the controller 112 controls the monitor 116 to display "RECOGNITION SUCCESS" and the total operation finishes.

EMBODIMENT 3

A description of a principle of the method for recognizing corners of an angular component by using an inner vector product in accordance with the third embodiment of the present invention is as follows. We assume that an optional pixel coordinate selected from an information string of the outline pixels which is detected by the controller 112 of the image processor 10 of a chip mounter system is Bi(x(i), y(i)). A first outline pixel Bi+m(x(i+m), y(i+m)) and a second outline pixel Bi−m(x(i−m), y(i−m)) are located back and forth apart from the optional pixel Bi(x(i), y(i)) by a predetermined pixel number m in searched outline information, respectively. Also an A is a first position vector between the optional pixel Bi(x(i), y(i)) and the first outline pixel Bi+m(x(i+m), y(i+m)), a B is a second position vector between the optional pixel Bi(x(i), y(i)) and the second outline pixel Bi−m(x(i−m), y(i−m)), and a Vinp(i) is the inner product of the first position vector A and the second position vector B. The absolute value |Vinp(i)| of the inner product Vinp(i) is a function which is subordinate to the predetermined pixel number m and an outline shape.

When the predetermined pixel number m is constant, the absolute value |Vinp(i)| of the inner product Vinp(i) is a function which depends on the outline shape. In particular, in an angular chip component a predetermined pixel number m which is constant, when the outline is a straight line thereof, the absolute value |Vinp(i)__ of the inner product Vinp(i) has the largest size. But when the optional pixel Bi(x(i), y(i)) is located at the corner thereof, the absolute value |Vinp(i)| of the inner product Vinp(i) has the smallest size.

Since the absolute value |Vinp(i)| of the inner product Vinp(i) has local minimums with respect to 4 corners of the angular component 104, first of all a minimum value Vmin and a maximum value Vmax of the absolute value __Vinp (i)__ of the inner product Vinp(i) is calculated by means of an equation (11) which will be described later.

$$Vmin=V(mini)=min(\_Vinp(k)\_, k=1,2, \ldots ,N-1,N) \qquad (11)$$

$$Vmax=V(maxi)=max(\_Vinp(k)\_, k=1,2, \ldots ,N-1,N)$$

The absolute value __Vinp(i)__ of the inner product Vinp (i) is divided into M stages, for example 10 stages, based on the Vmin. The corners of the angular component 104 are searched from the lowest stage to the highest stage. The minimum values of the outline pixels which are equal to or less than a predetermined value of each stage are set as the local minimums. The outline pixels which correspond to the local minimums are recognized as a corner Pi(Xi,Yi). That is, the Pi(Xi,Yi) is calculated by means of an expression (12) which will be described later.

$$Pi(Xi,Yi)=Bmini(X(min), Y(mini)) \qquad (12)$$

where Pi(Xi,Yi) indicates a coordinate of a corner of the angular component 104 if the absolute value __Vinp(i)__ has a minimum value at an optional point Bi.

Since the angular component 104 may be distorted from 0° to 180°, we cannot know which points of the angular component 104 correspond to the Pi(Xi, Yi), respectively. Accordingly, since the two corners which are adjacent to one another form two long sides, the corresponding location of each corner can be searched. The distortion angle is calculated based on an average value of the angle in which the two long sides form.

Figure 4A:
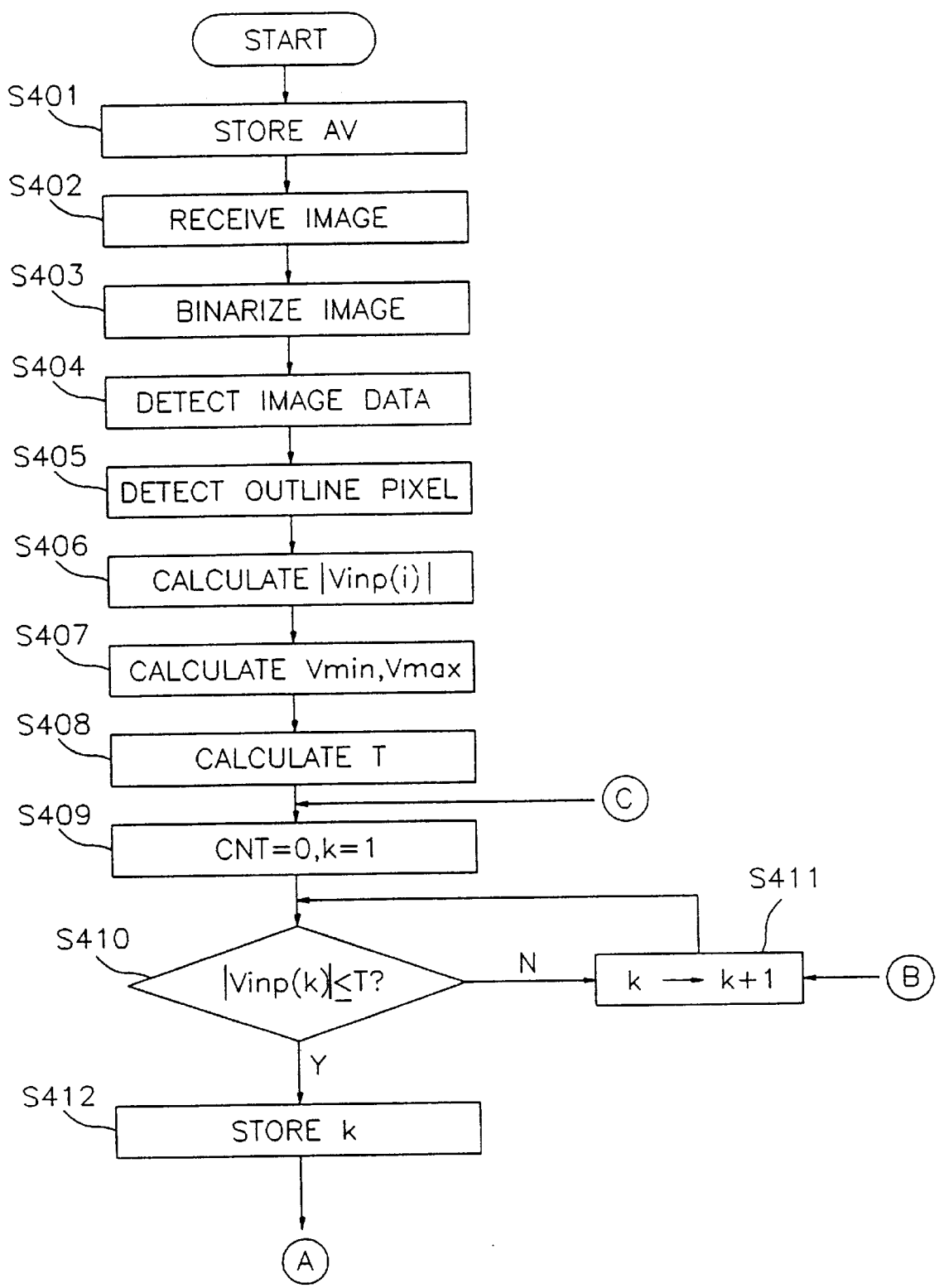
FIGS. 4A and 4B are flow charts for illustrating the method for recognizing corners of an angular component by using an inner vector product according to a first embodiment of the present invention.
Figure 4B:
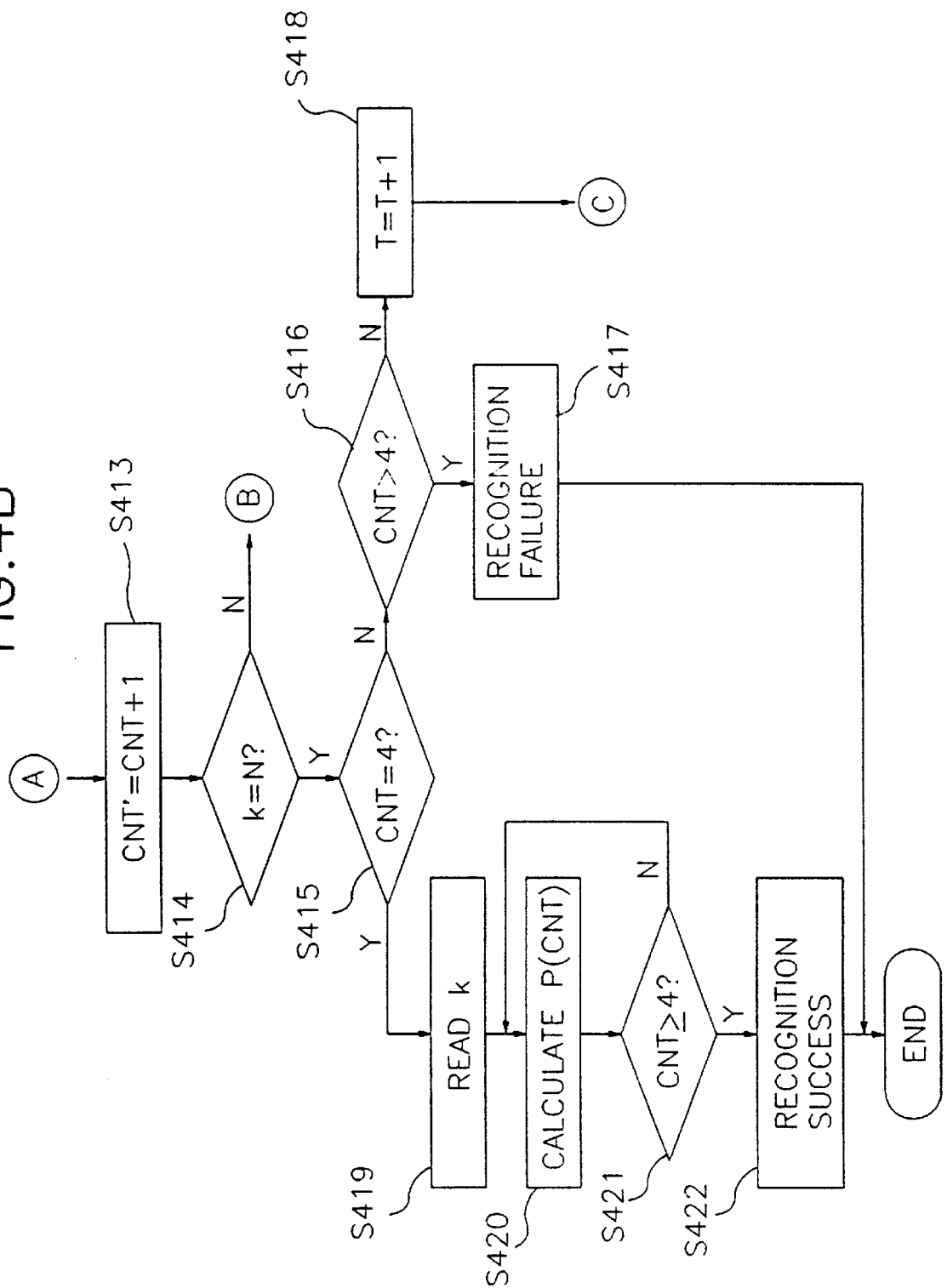

The operation of the method for recognizing corners of angular components by using an inner vector product according to the third embodiment of the present invention will hereinafter be described in detail with reference to FIGS. 1, 4A, and 4B. FIGS. 4A and 4B illustrate the method for recognizing corners of angular components by using an inner vector product according to the third embodiment of the present invention. Before recognizing the location and the distortion angle of angular components, the controller 112 controls the memory to store an average value of a brightness in a predetermined pixel and a total number AV of corners of a desired angular component therein (step S401). For example, when a brightness of a brightness of the candidate object is set at "1" and a brightness of the background of the candidate object is set at "0", the average value of a brightness may be determined as "½". Also, the total number AV of corners of a desired angular component is 3 when the angular component is a triangle component, and the total number AV is 4 when it is a square component.

Referring to FIG. 1, when the angular component 104 adhere to the nozzle 102 which is mounted to the mount heads 100 through a vacuum, the camera 106 takes a picture with respect to an image of the angular component 104 and transmits the image of the angular component 104 to an image processor section 110. The image processor 110 receives the image of a subject including the angular component 104 from the camera 106 and transmits the image of the subject to the controller 112 in step S402. In step S403, the controller 112 binarizes the received image of the angular component 104 from the image processing section 110. At this time, when the received image of the subject is greater than the average value AV of a brightness which is stored in the memory 114, the received image of the subject is set at "1". On the contrary, when the received image of the subject is equal to or less than the average value AV of a brightness, the received image of the chip component 104 is set at "0".

In step S404, the image processor 110 detects image data of the angular component 104 from an upper left pixel to a lower right pixel of the subject including the angular component 104 and transmits the detected image data of the angular component 104 to the controller 112. In step S405, the controller 112 detects outline pixel data of the candidate object from the image data of the candidate object detected by the image processing section 110 by means of a well-known eight direction outline detection method. In step S406, the controller calculates the absolute value |Vinp(i)| of the inner product Vinp(i) of the first location vector A and the second location vector B on the basis of the outline pixel data of the angular component 104.

In step S407, the controller 112 calculates a minimum value Vmini of the absolute value |Vinp(i)| of the inner product Vinp(i) by means of the equation (9). In step S408, the controller 112 calculates a threshold value T for detecting a corner of the angular component 104 by means of an equation (13) which will be described later.

$$T=Vmin*(Vmax-Vmin)*(M-CNT)/M, \; k=mini \qquad (13)$$

where, the threshold value T indicates a value which may be used in order to decide whether or not the outline pixel is the corner pixel. And when dividing between the minimum value Vmin and the maximum value Vmax into a predetermined interval, the M is the interval number, for example 10 stages including a first stage, a second stage, . . . , a ninth stage, and a tenth stage. For instance, when dividing between the minimum value Vmin and the maximum value Vmax into 10 stages by the predetermined interval, the threshold value T indicates the value with respect to a first stage within 10% from the minimum value Vmin, which is a value of a first stage. That is, the threshold value T is $^{10}/_{0}$ of the absolute value |Vinp(i)|. In step S409, the controller 112 starts a detection of a corner of the angular component 104 from a first outline pixel (k=1) and sets a corner count value CNT at "0" (CNT=0).

In step S410, the controller 112 judges whether or not an absolute value |Vinp(k)| of an optionally inner product Vinp(k) is equal to or less than the threshold value T. That is, the controller 112 sequentially judges whether or not an absolute value |Vinp(1)| of a first inner product Vinp(1), an absolute value _Vinp(2)_ of a second inner product Vinp (2) , . . . , an absolute value |Vinp(N−1)| of a N−1-th inner product Vinp(N−1), and an absolute value −Vinp(N)| of a N-th inner product Vinp(N) are equal to or less than the threshold value T, respectively. When it is judged that the absolute value |Vinp(k)| of the optionally inner product Vinp(k) is greater than the threshold value T in step S410, the controller 112 adds "1" to the outline pixel number of the angular component 104 and the routine returns to step S410 to thereby repeat the operation after step S410.

On the contrary, when it is judged that the absolute value −Vinp(k)− of the optionally inner product Vinp(k) is equal to or less than the threshold value T in step S410, the controller 112 controls the memory 114 to store the outline pixel number "k" of the absolute value |Vinp(k)| of the optionally inner product Vinp(k) therein (step S412). In step S413, the controller 112 adds "1" to a corner count value (CNT=CNT+1). In step S414, the controller 112 judges whether or not the outline pixel number "k" of the absolute value _Vinp(k)_ of the optionally inner product Vinp(k) is equal to the total number N of the outline pixels of the angular component 104. When it is judged that the outline pixel number "k" of the absolute value _Vinp(k)_ of the optionally inner product Vinp(k) is different from the total number N of the outline pixels in step S414, the routine returns to step S411 to thereby repeat the operation after step S411.

On the contrary, when it is judged that the outline pixel number "k" of the absolute value |Vinp(k)| of the optionally inner product Vinp(k) is equal to the total number N of the outline pixels in step S414, the controller 112 judges whether or not a corner count value CNT in which is stored memory 114 is equal to a total number "4" of corners of the angular component 104 which is stored in the memory 114 in step S401 (S 415). When it is judged that the corner count value CNT stored in memory 114 is different from the total number "4" of corners of the angular component 104 in step S415, the controller 112 judges whether or not the corner count value CNT is greater than "4" (step S316). When it is judged that the stored corner count value CNT is greater than "4" in step S316, the controller 112 controls the monitor 116 to display "RECOGNITION FAILURE" thereon and the total operation finishes.

When it is judged that the stored corner count value CNT is greater than "4" in step S416, the controller 112 calculates a threshold value T with respect to a second stage by means of an equation (14) which will be described later (step S418).

$$T=T+(Vdmax-Vdmin)/M, \; k=mini \qquad (14)$$

Then the routine returns to step S409 to thereby the operation after step S409.

On the other hand, when it is judged that the corner count value CNT stored in memory 114 is equal to the total number "4" of corners of the angular component 104 in step S415, the controller 112 reads out the outline pixel number "k" of the absolute value |Vinp(k)| of the optionally inner product Vinp(k) which is stored in memory 114 in step S412 therefrom (step S419). The controller 112 calculates a coordinate of a corner of the angular component 104 corresponding to the outline pixel number "k" of the absolute value |Vinp(k)| of the optionally inner product Vinp(k) which the |Vinp(k)| has a minimum value at an optional point Bi by means of an equation (15) which will be described later (step S420).

$$P(CNT)=Bmini(Xmini, Ymini) \qquad (15)$$

In step S421, the controller 112 judges whether or not the stored corner count value CNT is equal to or greater than "4". When it is judged that the stored corner count value CNT is less than "4" in step S421, the routine returns to step S420 to thereby repeat the operation after step S420. That is, steps S420 and S421 repeat until the coordinates with respect to all 4 corners of the angular component 104 are searched. On the contrary, when it is judged that the stored corner count value CNT is equal to or greater than "4" in step S421, the controller 112 controls the monitor 116 to display "RECOGNITION SUCCESS" and the total operation finishes.

As mentioned above, with accordance to the present invention, since only the outline shape of components is used in order to recognize corners of angular components, an operation is limited to the outline shape. Therefore, the present invention can recognize corners of angular components at a high speed, and exactly perform the recognition process, thereby mounting the components to an accurate position of the PCB.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A method for recognizing corners of an angular component, said method comprising the steps of:

i) storing a total number of a desired angular component;

ii) detecting outline pixels of the angular component by taking an image with respect to a subject including the angular component;

iii) calculating sums of first and second position vectors based on the outline pixels, wherein the first and second position vectors are between a reference outline pixel and a first outline pixel and between the reference outline pixel and a second outline pixel, respectively, and the first and second outline pixels are apart from the reference outline pixel by a number of predetermined pixels;

iv) sampling a reference maximum value having a largest magnitude from the vector sums;

v) calculating a threshold value for detecting corners of the angular component based on the reference maximum value;

vi) sequentially comparing the vector sums with the threshold value judging whether the corners thereof are detected according to the comparison result; and vii) comparing all corners of the angular component with the stored total number of the desired angular component and deciding whether an operation of recognizing the corners has succeeded according to the comparison result, wherein step vi) includes vi-1) sequentially judging whether the vector sums are equal to or greater than the threshold value, vi-2) adding one to an outline pixel number of the vector sum and returning to step vi-1) when the vector sum is less than the threshold value, and storing the outline pixel number of the vector sum when the vector sum is equal to or greater than the threshold value, vi-3) adding one to a corner count value of the annular component, and vi-4) judging whether the stored outline pixel number of the vector sum is equal to a total number of the outline pixels of the angular component detected in step i), returning to a step of adding one to an outline pixel number of the vector sum in step vi-2) when the stored outline pixel number is different from the total number of the outline pixel, and executing step vii) when the stored outline pixel number is equal to the total number of the outline pixels.

2. The method as recited in claim 1, wherein a magnitude of the vector sums varies according to the predetermined number of pixels, and an outline shape and the corners of the angular component.

3. The method as recited in claim 1, wherein step vii) includes vii-1) judging whether a number of the detected corners is equal to a total number of the corners of the angular component;

vii-2) judging whether the detected corner number is greater than the total number of the corners when the number of the detected corner is equal to the total number of the corners of the angular component in step vii-1), displaying a recognition failure when the number of the detected corner number is greater than the total number of the corners, and lowering the threshold value in order to repeat step v) when the number of the detected corner is less than the total number of the corners; and vii-3) sequentially calculating four corner coordinates of the angular component based on the detected corners thereof when the number of the detected corners is different from the total number of the corners of the angular component in step vii-1).

4. A method for recognizing corners of an angular component, said method comprising the steps of:

a) storing a total number of a desired angular component;

b) detecting outline pixels of the angular component by taking an image with respect to a subject including the angular component;

c) calculating differences of first and second position vectors based on the outline pixels, wherein the first and second position vectors are between a reference outline pixel and a first outline pixel and between the reference outline pixel and a second outline pixel, respectively, and the first and second outline pixels are apart from the reference outline pixel by a predetermined number of pixels;

d) sampling a reference minimum value having a smallest magnitude from the vector sums;

e) calculating a threshold value for detecting corners of the angular component based on the reference minimum value;

f) sequentially comparing the vector differences with the threshold value and judging whether or not the corners thereof are detected according to the comparison result; and g) comparing all corners of the angular component with the stored total number of the desired angular component and deciding whether an operation of recognizing the corners has succeeded according to the comparison result, wherein step f) includes f-1) sequentially judging whether the vector differences are equal to or greater than the threshold value; f-2) adding one to an outline pixel number of the vector difference and returning to step f-1) when the vector difference is less than the threshold value, and storing the outline pixel number of the vector difference when the vector difference is equal to or greater then the threshold value: f-3) adding one to a corner count value of the annular component; and f-4) judging whether the stored outline pixel number of the vector difference is equal to a total number of the outline pixels of the angular component detected in step a), returning to a step of adding one to an outline pixel number of the vector difference in step f-2) when the stored outline pixel number is different from the total number of the outline pixels, and going to step g) when the stored outline pixel number is equal to the total number of the outline pixels.

5. The method as recited in claim 4, wherein a magnitude of the vector sums varies according to the predetermined number of pixels, and an outline shape and a location of the angular component.

6. The method as recited in claim 4, wherein step g) includes g-1) judging whether a number of the detected corners is equal to a total number of the corners of the angular component;

g-2) judging whether the detected corner number is greater than the total number of the corners when the number of the detected corner is equal to the total number of the corners of the angular component in step g-1), displaying a recognition failure when the number of the detected corner is greater than the total number of the corners, and lowering the threshold value in order to repeat step e) when the number of the detected corner number is less than the total number of the corners; and g-3) sequentially calculating four corner coordinates of the angular component based on the detected corners thereof when the number of the detected corner is different from the total number of the corners of the angular component in step g-1).

7. A method for recognizing corners of an angular component, said method comprising the steps of:

I) storing a total number of a desired angular component;

II) detecting outline pixels of the angular component by taking an image with respect to a subject including the angular component;

III) calculating inner products of first and second position vectors based on the outline pixels, wherein the first and second position vectors are between a reference outline pixel and a first outline pixel and between the reference outline pixel and a second outline pixel, respectively, and the first and second outline pixels are apart from the reference outline pixel by a predetermined number of pixels;

IV) sampling a reference minimum value having a smallest magnitude from the inner vector products;

V) calculating a threshold value for detecting corners of the angular component based on the reference minimum value;

VI) sequentially comparing the inner vector products with the threshold value and judging whether the corners thereof are detected according to the comparison result; and VII) comparing all corners of the angular component with the stored total number of the desired angular component and deciding whether an operation of recognizing the corners has succeeded according to the comparison result wherein step VI) includes VI-1) sequentially judging whether the inner vector products are equal to or greater than the threshold value; VI-2) adding one to an outline pixel number of the inner vector products and returning to step VI-1) when the inner vector product is less than the threshold value, and storing the outline pixel number of the inner vector product when the inner vector product is equal to or greater than the threshold value; VI-3) adding one to a corner count value of the angular component: and VI-4) judging whether the stored outline pixel number of the inner vector product is equal to a total number of the outline pixels of the angular component detected in step II), returning to a step of adding one to an outline pixel number of the inner vector product in step VI-2) when the stored outline pixel number is different from the total number of the outline pixels, and going to step VII) when the stored outline pixel number is equal to the total number of the outline pixels.

8. The method as recited in claim 7, wherein step VII) includes

VII-1) judging whether a number of the detected corners is equal to a total number of the corners of the angular component;

VII-2) judging whether the detected corner number is greater than the total number of the corners when the number of the detected corner numbers is equal to the total number of the corners of the angular component in step VII-1), displaying a recognition failure when the number of the detected corner number is greater than the total number of the corners, and lowering the threshold value in order to repeat step V) when the number of the detected corner number is less than the total number of the corners; and VII-3) sequentially calculating four corner coordinates of the angular component based on the detected corners thereof when the number of the detected corners is different from the total number of the corners of the angular component in step VII-1).

* * * * *